United States Patent
Kajiwara et al.

(10) Patent No.: US 7,924,232 B2
(45) Date of Patent: Apr. 12, 2011

(54) ELECTROMAGNETIC WAVE MEASURING METHOD AND ELECTROMAGNETIC WAVE MEASURING APPARATUS

(75) Inventors: Shoichi Kajiwara, Osaka (JP); Hiroyuki Tani, Osaka (JP)

(73) Assignee: Panasonic Corporation, Osaka (JP)

( * ) Notice: Subject to any disclaimer, the term of this patent is extended or adjusted under 35 U.S.C. 154(b) by 337 days.

(21) Appl. No.: 12/141,510

(22) Filed: Jun. 18, 2008

(65) Prior Publication Data

US 2008/0316123 A1 Dec. 25, 2008

(30) Foreign Application Priority Data

Jun. 21, 2007 (JP) ................................. 2007-163777

(51) Int. Cl.
*G01R 29/10* (2006.01)
(52) U.S. Cl. ................. 343/703; 343/700 MS; 343/754; 343/793; 343/795
(58) Field of Classification Search ................. 343/703, 343/700 MS, 754, 793, 795; 324/258, 260, 324/750, 754
See application file for complete search history.

(56) References Cited

U.S. PATENT DOCUMENTS

| | | | |
|---|---|---|---|
| 5,218,294 A | 6/1993 | Soiferman | |
| 5,936,237 A * | 8/1999 | van der Weide | 250/234 |
| 6,259,249 B1 * | 7/2001 | Miyata | 324/207.17 |
| 6,300,779 B1 | 10/2001 | Tamaki et al. | |
| 6,661,243 B2 | 12/2003 | Tamaki et al. | |
| 7,358,749 B2 * | 4/2008 | Kazama et al. | 324/750 |
| 7,430,920 B2 * | 10/2008 | Sumigawa et al. | 73/777 |
| 7,511,485 B2 * | 3/2009 | Funato | 324/260 |
| 7,595,650 B2 * | 9/2009 | Funato et al. | 324/754 |
| 7,642,973 B2 * | 1/2010 | Maekawa et al. | 343/703 |
| 2009/0006011 A1 * | 1/2009 | Kazawa et al. | 702/57 |

FOREIGN PATENT DOCUMENTS

| | | |
|---|---|---|
| JP | 10-104294 A | 4/1998 |
| JP | 2000-074969 A | 3/2000 |
| JP | 2000-214198 A | 8/2000 |
| JP | 2005-17241 | 1/2005 |
| JP | 2005-165525 | 6/2005 |
| JP | 2006-38503 | 2/2006 |
| JP | 2006-208019 | 8/2006 |

OTHER PUBLICATIONS

English language Abstract JP 2000-074969 A.
English language Abstract JP 2000-214198 A.
English language Abstract JP 10-104294 A.
English language Abstract JP 2006-208019, Aug. 10, 2006.
English language Abstract JP 2005-17241, Jan. 20, 2005.
English language Abstract JP 2005-165525, Jun. 23, 2005.
English language Abstract JP 2006-38503, Feb. 9, 2006.

* cited by examiner

*Primary Examiner* — Douglas W Owens
*Assistant Examiner* — Chuc D Tran
(74) *Attorney, Agent, or Firm* — Greenblum & Bernstein, P.L.C.

(57) ABSTRACT

An electromagnetic wave measuring method is provided that is capable of performing high-precision measurement in a shorter time and in a greater variety of frequency bands than heretofore with a comparatively simple configuration. A plate-like antenna (13) of which the outline shape of an opposed surface opposite a measured object (5) is similar to the outline shape of an opposed surface of the measured object (5) is brought close to the measured object (5), and an electromagnetic wave from the measured object (5) is measured based on the frequency spectrum of a received signal received by the plate-like antenna (13).

6 Claims, 9 Drawing Sheets

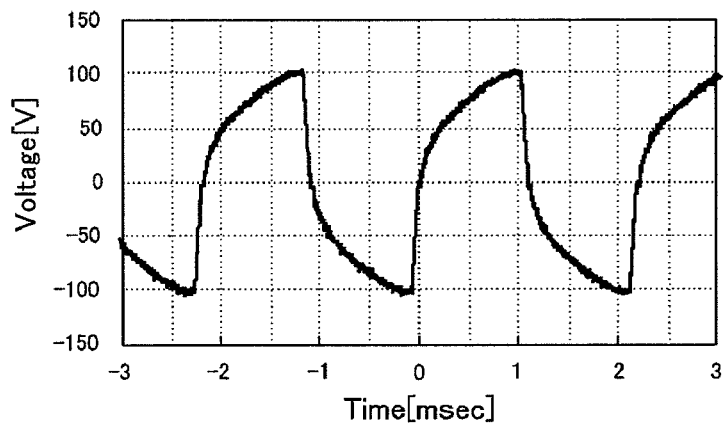
FIG.5A INPUT VOLTAGE WAVEFORM (200 $V_{P-P}$, 450 Hz)
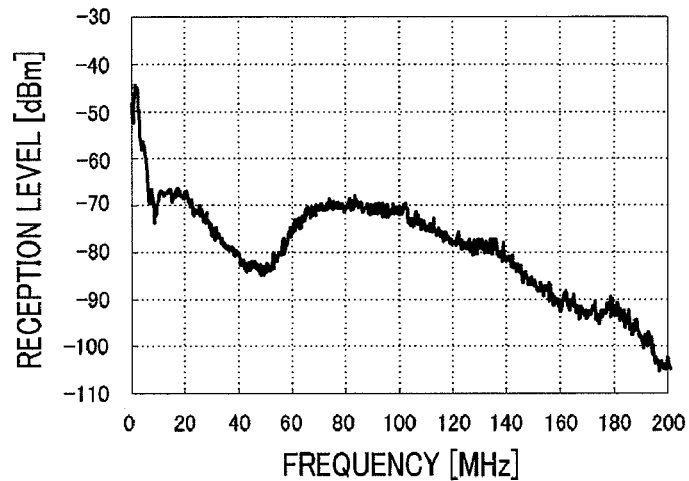
FIG.5B WIDEBAND SPECTRUM
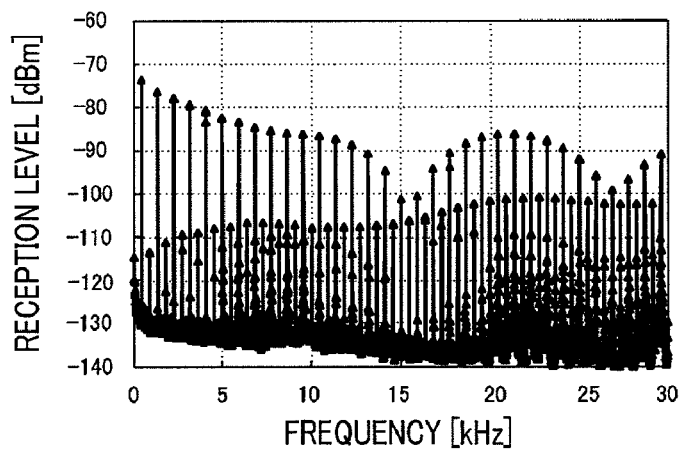
FIG.5C NARROWBAND SPECTRUM

ELECTROMAGNETIC WAVE MEASURING METHOD AND ELECTROMAGNETIC WAVE MEASURING APPARATUS

CROSS REFERENCE TO RELATED APPLICATIONS

The disclosure of Japanese Patent Application No. 2007-163777 filed on Jun. 21, 2007 including the specification, drawings and abstract is incorporated herein by reference in its entirety.

BACKGROUND OF THE INVENTION

1. Field of the Invention

The present invention relates to an electromagnetic wave measuring method and electromagnetic wave measuring apparatus used to measure an electromagnetic wave from an electronic device.

2. Description of the Related Art

In recent years, regulations have been established in many countries to minimize interference due to unwanted emissions generated by various kinds of electronic devices. For example, outside of Japan, standards have been drawn up by the FCC (Federal Communications Commission) in the United States, the CISPR (International Special Committee on Radio Interference), the VDE (Verband Deutscher Elecktrotechniker), and so forth. In Japan, a voluntary regulatory standard has been decided upon by the VCCI (Voluntary Control Council for Interference by Information Technology), and electronic equipment manufacturers are undertaking measures to suppress unwanted emissions generated by various kinds of electronic devices.

In the electromagnetic wave measuring method according to this standard, field strength is measured at a position a predetermined distance from an electronic device that is a source of unwanted emission, and a special measuring environment and measuring instrument are used, so that considerable expertise is necessary in terms of the measuring technology. Also, the electromagnetic wave measuring method according to this standard measures an electromagnetic wave at a distance of 3 [m] or 10 [m] from a measured object.

Meanwhile, ascertaining the state of electromagnetic waves generated by various kinds of circuit operation in logic circuits, which have been increasing in speed in recent years, and radio communication devices incorporating various functions, has become important in improving signal quality. In electronic devices such as radio communication devices, in particular, waves that are a multiple of the circuit operating clock frequency are a factor causing degradation of radio communication quality. Furthermore, waves that are a multiple of the circuit operating clock frequency lead to such problems as malfunction due to mutual signal interference. This is referred to as an autotoxication problem (whereby a device's own operating clock affects the device's own operational functions).

This autotoxication problem is extremely difficult to solve in the case of the aforementioned standard measuring method that measures a distance. This is because, with distance measurement, interference problems within a circuit and the behavior of an extremely near electromagnetic field cannot be observed, making it difficult to identify where the source of an electromagnetic wave is located in an electronic device.

Thus, many electromagnetic wave measuring apparatuses have been proposed and commercialized whereby, for example, scanning measurement of a near electromagnetic field of an electronic device is performed using an electric field sensor or magnetic field sensor, and the source of an electromagnetic wave is estimated by measuring the near electromagnetic field distribution of a measured object. An example of a near electromagnetic field distribution measuring instrument is one that measures two-dimensional electromagnetic field distribution by scanning a plane in the proximity of a measured object, identifies a large part of a radiated electromagnetic field from the distribution image, and performs evaluation of the electromagnetic field radiated from the measured object based on the identification result (see Unexamined Japanese Patent Publication No. 2000-74969, for example).

There is also a measuring apparatus that improves the precision of near magnetic field measurement by performing calibration of a magnetic field probe using a reference antenna (see Unexamined Japanese Patent Publication No. 2000-214198, for example).

However, a conventional near electromagnetic field measuring instrument requires from several minutes to several hours to perform a scan with an electromagnetic field probe in the vicinity of a measured object (electronic device). Therefore, while useful for analysis in the product development stage, a problem with a conventional near electromagnetic field measuring instrument is the extremely high cost incurred if used in a mass production plant that produces tens of thousands of products a day.

Also, the reception sensitivity of an electromagnetic field probe used in a near electromagnetic field distribution measuring instrument decreases the lower the frequency, and reception is difficult for low frequencies on the order of tens of kilohertz. Another problem is thus the possibility of not being able to receive all the signals present in an electronic device.

A method has been proposed whereby a plate-like antenna having a plurality of sensor arrays is positioned close to a printed wiring board that is a test object, and whether or not there is a defect in the printed wiring board is detected by detecting an electromagnetic wave radiated from the printed wiring board (U.S. Pat. No. 5,218,294). Furthermore, an electromagnetic noise measuring apparatus has been proposed that identifies a noise generation location in a measured electromagnetic noise generating body by positioning a microstrip array in which a plurality of microstrip coils are arranged opposite the measured electromagnetic noise generating body (Unexamined Japanese Patent Publication No. HEI 10-104294).

SUMMARY OF THE INVENTION

It is an object of the present invention to provide an electromagnetic wave measuring method and electromagnetic wave measuring apparatus capable of performing high-precision measurement in a shorter time and in a greater variety of frequency bands than heretofore with a comparatively simple configuration.

The present invention achieves the above object by bringing a plate-like antenna of which the outline shape of an opposed surface opposite a measured object is similar to the outline shape of an opposed surface of that measured object close to the measured object, and measuring an electromagnetic wave from the measured object based on a frequency spectrum of a received signal received by the plate-like antenna.

BRIEF DESCRIPTION OF THE DRAWINGS

FIG. 5 is a drawing showing an example of electromagnetic wave measurement by an electromagnetic wave measuring apparatus of Embodiment 1, in which FIG. 5A is a graph showing an input voltage waveform to a microstrip line that is a measured object, FIG. 5B is a graph showing a wideband spectrum, and FIG. 5C is a graph showing a narrowband spectrum;

DETAILED DESCRIPTION OF THE PREFERRED EMBODIMENTS (Process whereby the present invention was arrived at)

First, before describing embodiments of the present invention, the process whereby the present invention was arrived at will be described.

Figure 1:
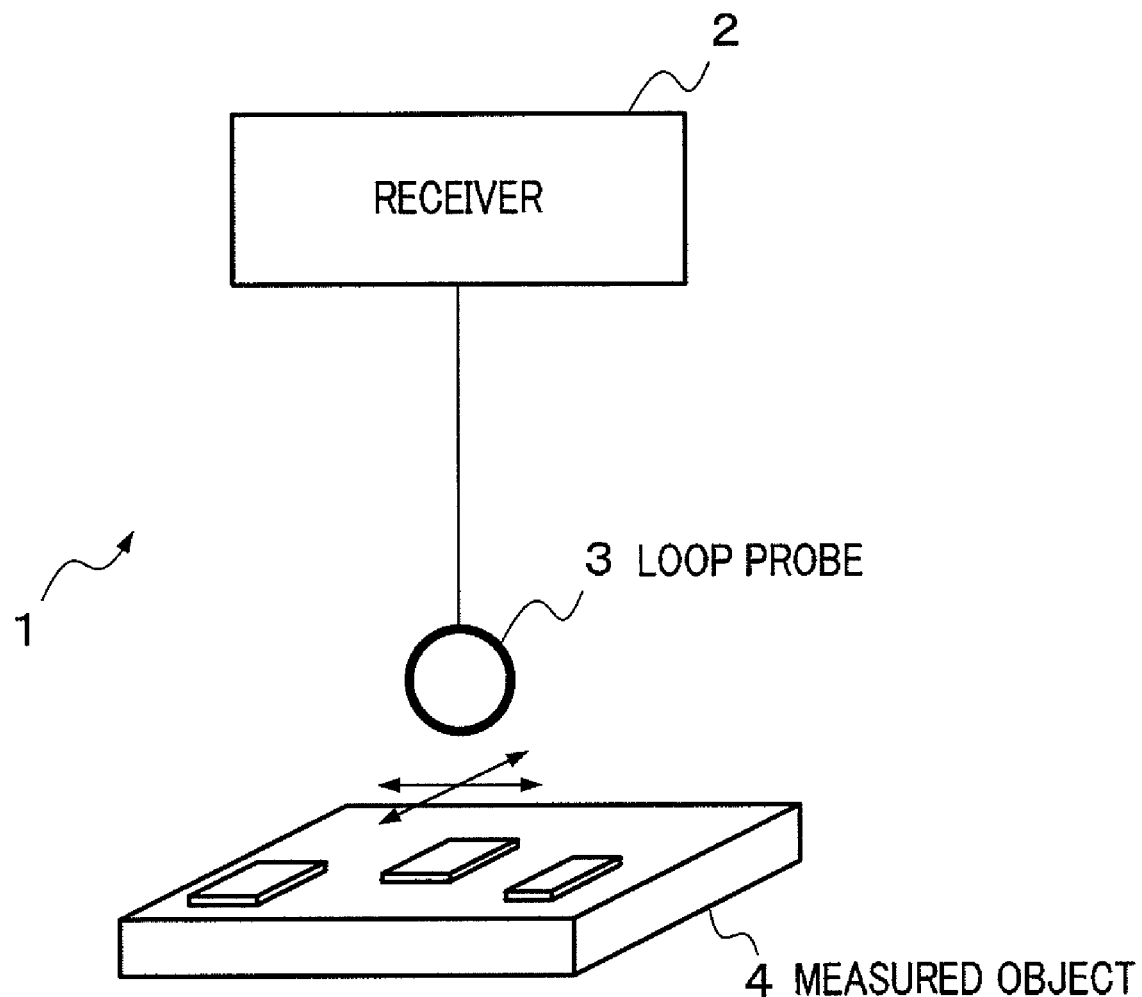
FIG. 1 is a drawing showing an example of near electromagnetic field measurement using a loop probe.
Figure 2:
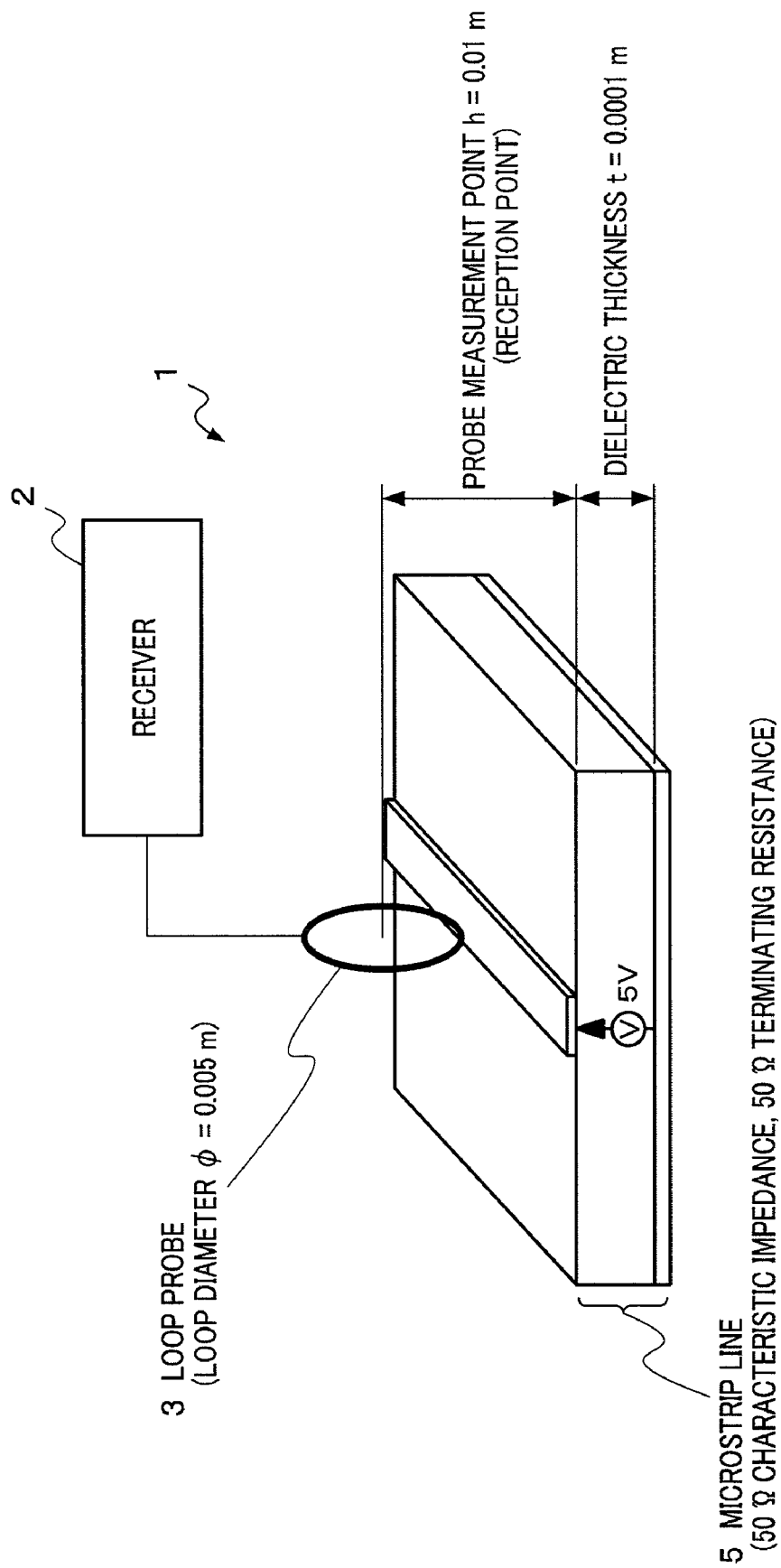
FIG. 2 is a drawing showing an example of measurement of an electromagnetic wave from a microstrip line.

The inventors of the present invention first tried performing measurement of a near magnetic field of a measured object using an electromagnetic wave measuring apparatus of typical configuration, as shown in FIG. 1 and FIG. 2.

FIG. 1 shows a sample configuration of an electromagnetic wave measuring apparatus that measures a near electromagnetic field using a loop probe. Electromagnetic wave measuring apparatus 1 has loop probe 3 attached to receiver 2, and can measure near magnetic field distribution of measured object (electronic device) 4 by scanning with loop probe 3 in the vicinity of measured object 4.

Here, loop probe 3 generates an electromotive force (effective value) proportional to a high-frequency magnetic field in receiver 2, which is a load, in accordance with Faraday's law. Receiver 2 detects near magnetic field distribution by detecting this electromotive force on a frequency-by-frequency basis.

The structure of loop probe 3 can be implemented easily by forming a signal line into a loop. A shield structure can also easily be implemented for loop probe 3, reducing the effects of the connecting cable as compared with a field-type probe, and enabling high-precision near magnetic field distribution measurement to be performed.

Received power P (effective value) of receiver 2 according to Faraday's law is calculated by means of the following equation.

[1]

$$P = \frac{(\mu_0 \omega S H_0)^2}{2Z_0} \quad \text{(Equation 1)}$$

The meaning of the constants and variables in Equation (1) is as follows.

Permeability of vacuum magnetic constant $\mu_0=4\pi \times 10^{-7}$ [H/m]
Angular frequency $\omega=2\pi f$ (f: frequency) [rad/s]
Loop area S [m$^2$]
Observed magnetic field amplitude Ho [A/m]
Receiver load $Z_0=50[\Omega]$ The inventors of the present invention performed measurement by means of electromagnetic wave measuring apparatus 1 of an electromagnetic wave from microstrip line 5 widely used as a standard near magnetic field measurement reference, as shown in FIG. 2.

Here, loop probe 3 loop diameter $\phi=0.005$ [m], and probe observation point (distance from microstrip line 5 to the center of the loop) h=0.01 [m]. For the structure of measured microstrip line 5, the rear surface was made the ground, with dielectric thickness t=0.0001 [m], and a line characteristic impedance of 50 [Ω]. The input voltage was made 5 [V], and the opposite side was terminated by a 50 [Ω] resistance.

If a current flowing in microstrip line 5 at this time is designated I, strength Ho at probe observation point h of the magnetic field radiated from microstrip line 5 is generally found by means of the following equation.

[2]

$$H_0 = \frac{I \cdot t}{\pi \cdot h(h + 2 \cdot t)} \quad \text{(Equation 2)}$$

Figure 3:
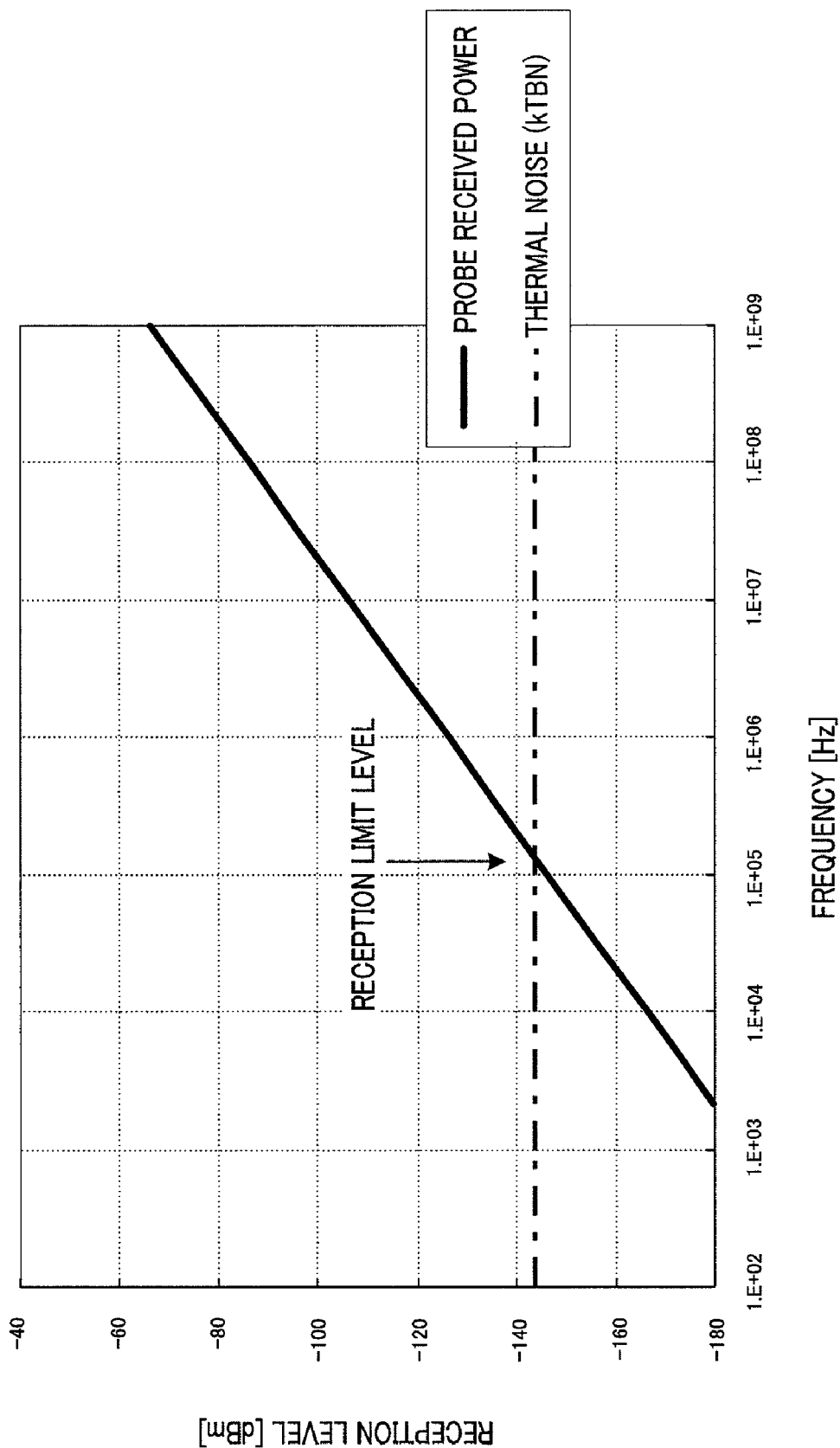
FIG. 3 is a graph showing the frequency characteristic of a received signal when a near electromagnetic field is measured using a loop probe.

The relationship between the reception level and frequency in receiver 2 calculated using Equation (1) and Equation (2) is shown by the solid line in FIG. 3. The thermal noise level (minimum reception sensitivity) of receiver 2 for a receiver 2 NF (noise figure) of 20 [dB], a bandwidth of 10 [kHz] generally frequently used in noise observation, and an absolute temperature of 300 [K (Kelvin)], is shown by the dash-dot line in FIG. 3.

The following can be seen from FIG. 3. The received power of loop probe 3 increases as the frequency increases. On the other hand, since the thermal noise level is 143 [dBm], measurement of frequencies below a hundred and several tens of kHz—a reception level lower than the reception limit level shown in the figure—is impossible in principle. If the diameter of loop probe 3 is increased, received power P increases according to Equation (1), but on the other hand, the spatial resolution for observing near magnetic field distribution declines. Also, phenomena such as self-resonance due to the circumference of the loop become manifest, and the frequency characteristic is degraded.

In this way, the inventors of the present invention demonstrated that measurement of a low-frequency electromagnetic wave generated by an electronic device is in actuality difficult with an electromagnetic wave measuring apparatus that uses a loop probe.

Furthermore, as stated above, scanning of an electronic device with a loop probe is necessary in order to measure a near electromagnetic field of an electronic device with an electromagnetic wave measuring apparatus that uses a loop probe, and scanning of a single electronic device takes from several minutes to several hours. Therefore, while useful for analysis in the product development stage, the use of such an apparatus is extremely costly in a mass production plant that produces tens of thousands of products a day.

With reference now to the accompanying drawings, embodiments of the present invention will be explained in detail below.

Embodiment 1

Figure 4:
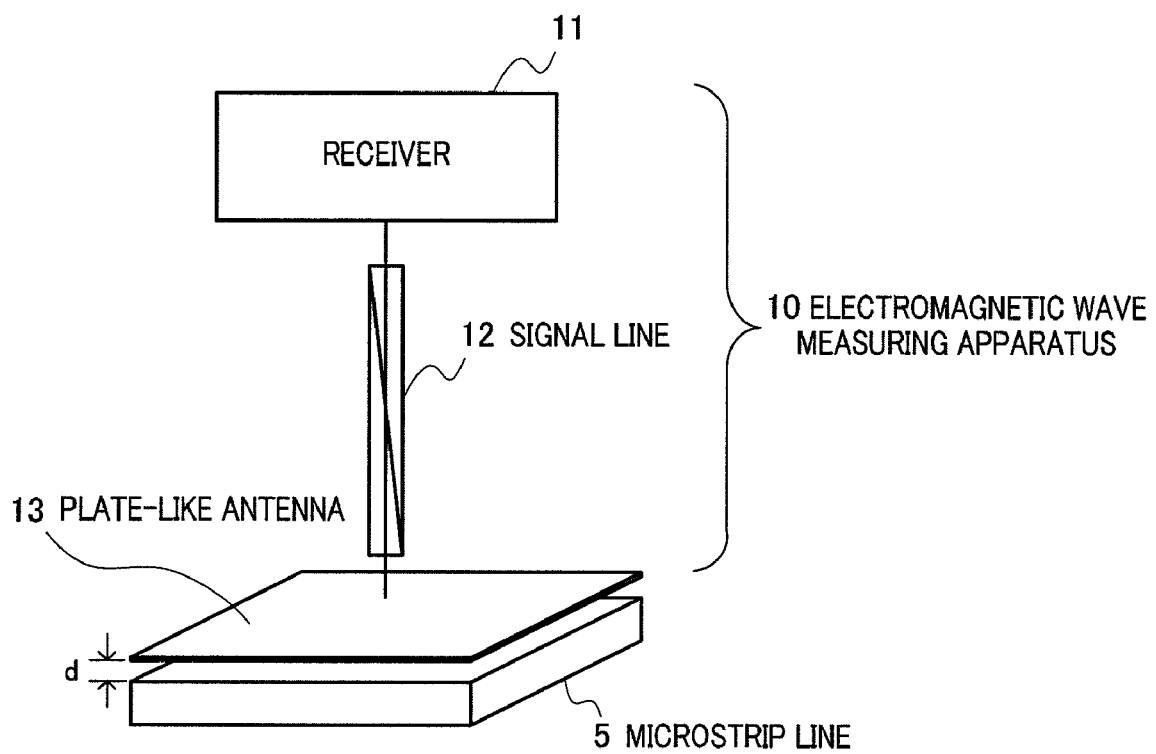
FIG. 4 is a drawing showing the configuration of an electromagnetic wave measuring apparatus according to Embodiment 1 of the present invention.

FIG. 4 shows the basic configuration of an electromagnetic wave measuring apparatus of this embodiment. Electromagnetic wave measuring apparatus 10 has plate-like antenna 13 attached to receiver 11 via signal line 12.

Receiver 11 has a frequency spectrum analysis section (not shown) that analyzes the frequency spectrum of a received signal input via signal line 12.

Plate-like antenna 13 is configured by means of a metal plate such as a copper plate or aluminum plate. Plate-like antenna 13 has a shape similar to the shape of a measured object. Specifically, the outline shape of an opposed surface of plate-like antenna 13 opposite a measured object is similar to the outline shape of an opposed surface of that measured object. In the case of this embodiment, the measured object is microstrip line 5, which is rectangular in shape, and therefore the outline shape of plate-like antenna 13 is rectangular.

Also, in the case of this embodiment, plate-like antenna 13 is configured by means of a dielectric base material coppered on one side, which enables metallic connection (shorting) to the measured object (microstrip line 5) to be prevented. Specifically, the opposed surface of plate-like antenna 13 opposite the measured object is coated with an insulating material. If a value that optimizes the distance between plate-like antenna 13 and the measured object described later herein is selected for the film pressure of the insulating film, the distance between plate-like antenna 13 and the measured object can be optimized by bringing plate-like antenna 13 into contact with the measured object.

Signal line 12 is configured by means of a coaxial line, for example, with the core part electrically connected to plate-like antenna 13 and the ground line unconnected.

In electromagnetic wave measuring apparatus 10 with the above configuration, when an electromagnetic wave (noise) is generated by microstrip line 5, plate-like antenna 13 causes capacitive coupling to the noise source. Thus, that noise spectrum can be observed by the frequency spectrum analysis section provided in receiver 11.

Thus, electromagnetic wave measuring apparatus 10 enables an electromagnetic wave from a measured object to be measured simply by setting plate-like antenna 13 above the measured object, without performing scanning with an antenna above the measured object, and allows an electromagnetic wave to be measured in a short time.

In order to confirm the effectiveness of electromagnetic wave measuring apparatus 10 of this embodiment, electromagnetic wave measurement was performed using electromagnetic wave measuring apparatus 10. FIG. 5 shows the measurement results. In this measurement example, microstrip line 5 such as shown in FIG. 2 was used as the measured object.

FIG. 5A shows an input voltage waveform to microstrip line 5. The input voltage waveform is that of a typical step-up drive IC, with DC input of approximately 3 [V] to 5 [V] converted to approximately 200 $V_{P-P}$, 450 [Hz], and a step-up regulator switching frequency of approximately 130 [kHz].

The input voltage waveform in FIG. 5A is input to microstrip line 5, plate-like antenna 13 is brought close to microstrip line 5 as shown in FIG. 4, and the measured spectra are as shown in FIG. 5B and FIG. 5C. FIG. 5B is a spectrum when the observed bandwidth (resolution bandwidth: RBW) is 8 [MHz], and observation is performed in a wide band up to 200 [MHz]. FIG. 5C is a spectrum when the observed bandwidth (resolution bandwidth: RBW) is [MHz], and observation is performed in a narrow band up to 30 [MHz]. From FIG. 5B and FIG. 5C it can be seen that the use of an electromagnetic wave measuring apparatus of this embodiment enables the noise spectrum to be measured with good sensitivity both in a wide band and in a narrow band.

As described above, according to this embodiment, by providing plate-like antenna 13 with a shape similar to the shape of a measured object, bringing plate-like antenna 13 close to the measured object, and measuring an electromagnetic wave from the measured object based on the frequency spectrum of a received signal received by plate-like antenna 13, noise measurement becomes possible simply by bringing plate-like antenna 13 close to the measured object, without performing scanning with a probe as with a typical loop probe, and an electromagnetic wave measuring method and electromagnetic wave measuring apparatus can be implemented that enable high-precision measurement to be performed in a short time and in a variety of frequency bands.

In the above embodiment, a case has been described in which the measured object is microstrip line 5, and therefore the shape (outline) of plate-like antenna 13 is made to conform to microstrip line 5, but if the measured object is an electronic device, a plate-like antenna may be used that has an outline shape conforming to the shape of a printed wiring board or chassis installed therein. By this means, a measurement result extremely similar to a near magnetic field (noise level) actually radiated by the measured object can be obtained.

An explanation will now be given of approximately how close it is desirable for plate-like antenna 13 of this embodiment to be brought to a measured object.

It is desirable for the distance between plate-like antenna 13 and a measured object to be made such that the coupling amount (reception sensitivity) with an electromagnetic field at each point on plate-like antenna 13 opposite the measured object is as far as possible the same (that is, reception sensitivity is uniform over the entire area of plate-like antenna 13).

It is also desirable for the distance between plate-like antenna 13 and the measured object (measurement distanced) to be set as shown below according to the maximum frequency of the measured frequency band (fmax [Hz]).

Normally, the boundary between a near field and distant field for a point wave source is defined by a radian sphere whose radius r [m] is expressed by the following equation: [3]

$$r = \lambda/2\pi [m] \qquad \text{(Equation 3)}$$

where λ is the wavelength of an electromagnetic wave.

When electromagnetic coupling is used as with plate-like antenna 13 of this embodiment, it is desirable for distance d between plate-like antenna 13 and a measured object to be made less than or equal to 1/10 of radian sphere radius r.

From the above, distance d between plate-like antenna 13 and a measured object should be set in accordance with the following equation. [4]

$$d \leq \lambda max/20\pi \qquad \text{(Equation 4)}$$

Here, λmax indicates the wavelength of the maximum frequency of the measured frequency band (fmax [Hz]). For example, when fmax=1 [GHz], λmax=0.3 [m]. In this case, therefore, a setting of $d \leq 4.78 \times 10^{-3}$ [m]≈5 [mm] should be selected.

In this case (when fmax=1 [GHz] and d≦5 [mm]) if measurement distance d varies by ±1 [mm], variation of approximately ±2 dB occurs in the coupling amount. Taking measurement system variation (of approximately ±1 dB, for example) and so forth into consideration, it is necessary for variation in the coupling amount at each point on plate-like antenna 13 opposite the measured object to be approximately ±2 dB or less.

From the above, it is desirable for plate-like antenna 13 to be shaped so as satisfy a criterion of approximately ±20% of measurement distance d with respect to a measured object. In other words, it is desirable for the outline shape of the opposed surface of plate-like antenna 13 opposite a measured object to be similar to the outline shape of the opposed surface of that measured object with an error of not more than approximately ±20% of measurement distance d.

Embodiment 2

In this embodiment, a noise testing method using electromagnetic wave measuring apparatus 10 described in Embodiment 1 will be explained in detail.

Figure 6:
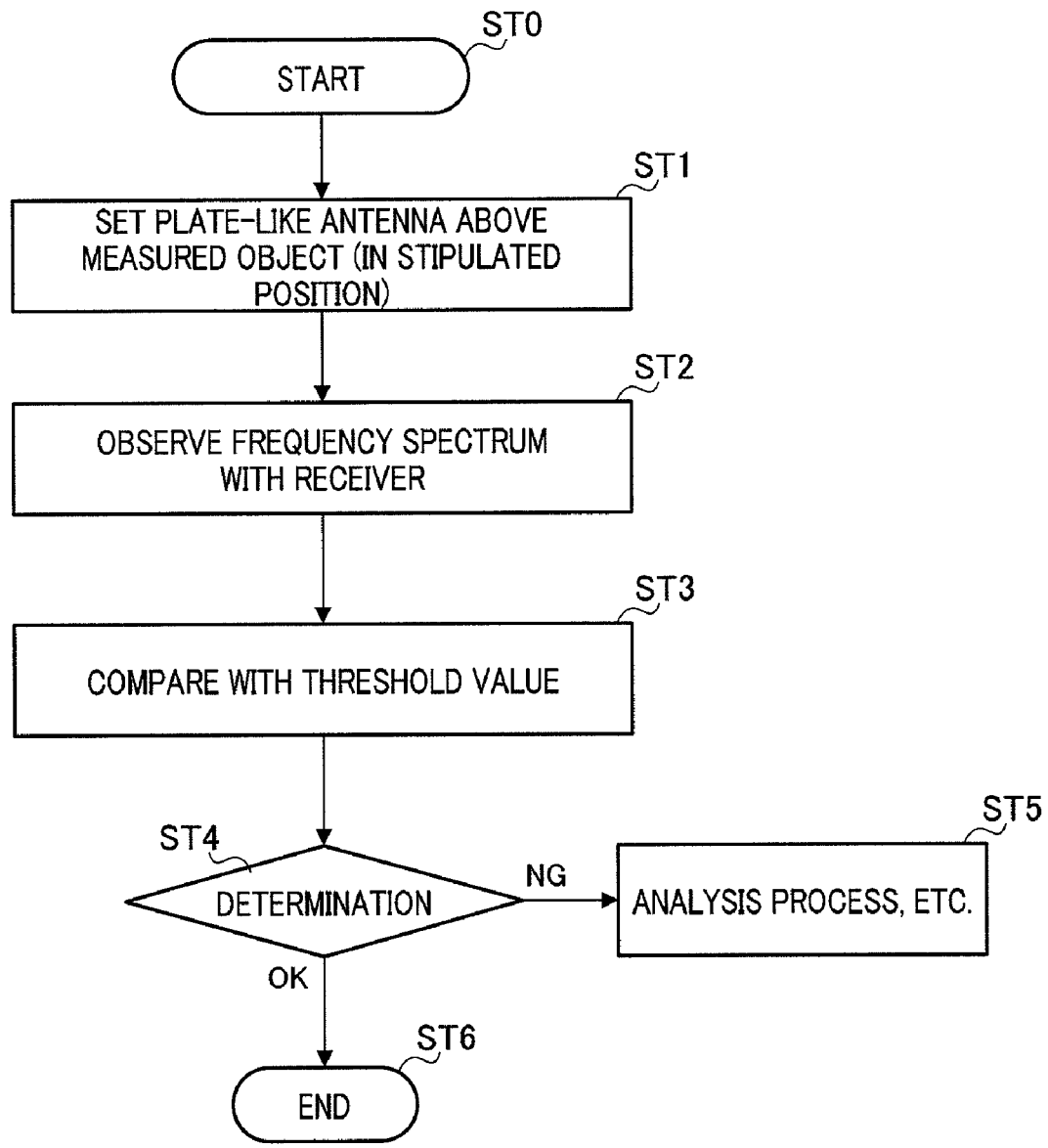
FIG. 6 is a flowchart showing a noise testing procedure using an electromagnetic wave measuring apparatus of Embodiment 1.

FIG. 6 is the simplest flowchart for implementing a noise testing method of this embodiment.

When noise testing processing is started in step ST0, plate-like antenna 13 is first set in a stipulated position above a measured object in step ST1. Plate-like antenna 13 has a shape similar to the shape of the test object (product) as described above, by which means observation precision is improved.

Next, in step ST2, a frequency spectrum is observed by receiver 11. A commercially available spectrum analyzer or the like is used in receiver 11.

Figure 7:
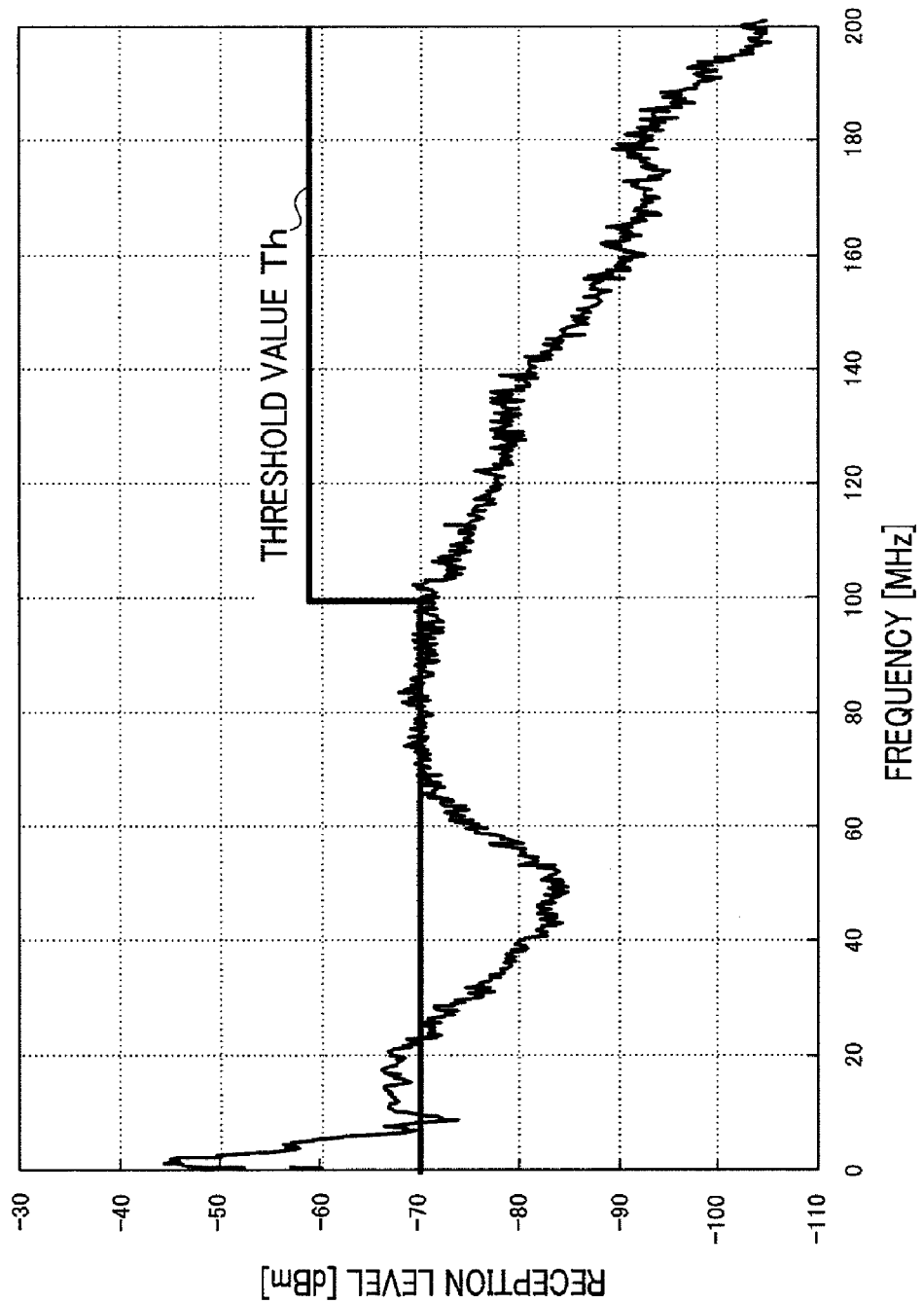
FIG. 7 is a graph providing an explanation of threshold value comparison.

Then, in step ST3, the reception level of the frequency spectrum observed in step ST2 is compared with a threshold value. This is illustrated in FIG. 7. Here, threshold value Th is a design guaranteed value, being a level for which there is a possibility of the electronic device that is the measured object malfunctioning if that value is exceeded. Threshold value Th should be set after prior investigation in the product design stage.

Next, in step ST4, measured object determination is performed based on the step ST3 comparison result. That is to say, if the reception level is greater than threshold value Th, an NG determination is made, the processing flow proceeds to step ST5, and defect countermeasures or the like are carried out by performing a measured object analysis process or the like. On the other hand, if the reception level is less than or equal to threshold value Th, an OK determination is made, the processing flow proceeds to step ST6, and the noise testing processing is terminated. In the case shown in FIG. 7, an NG determination is made for a frequency of 30 [MHz] or below.

Embodiment 3

In this embodiment, a mode is described in which an electromagnetic wave measuring apparatus of the present invention is applied to a radio communication device (a small radio device such as a mobile phone).

Figure 8:
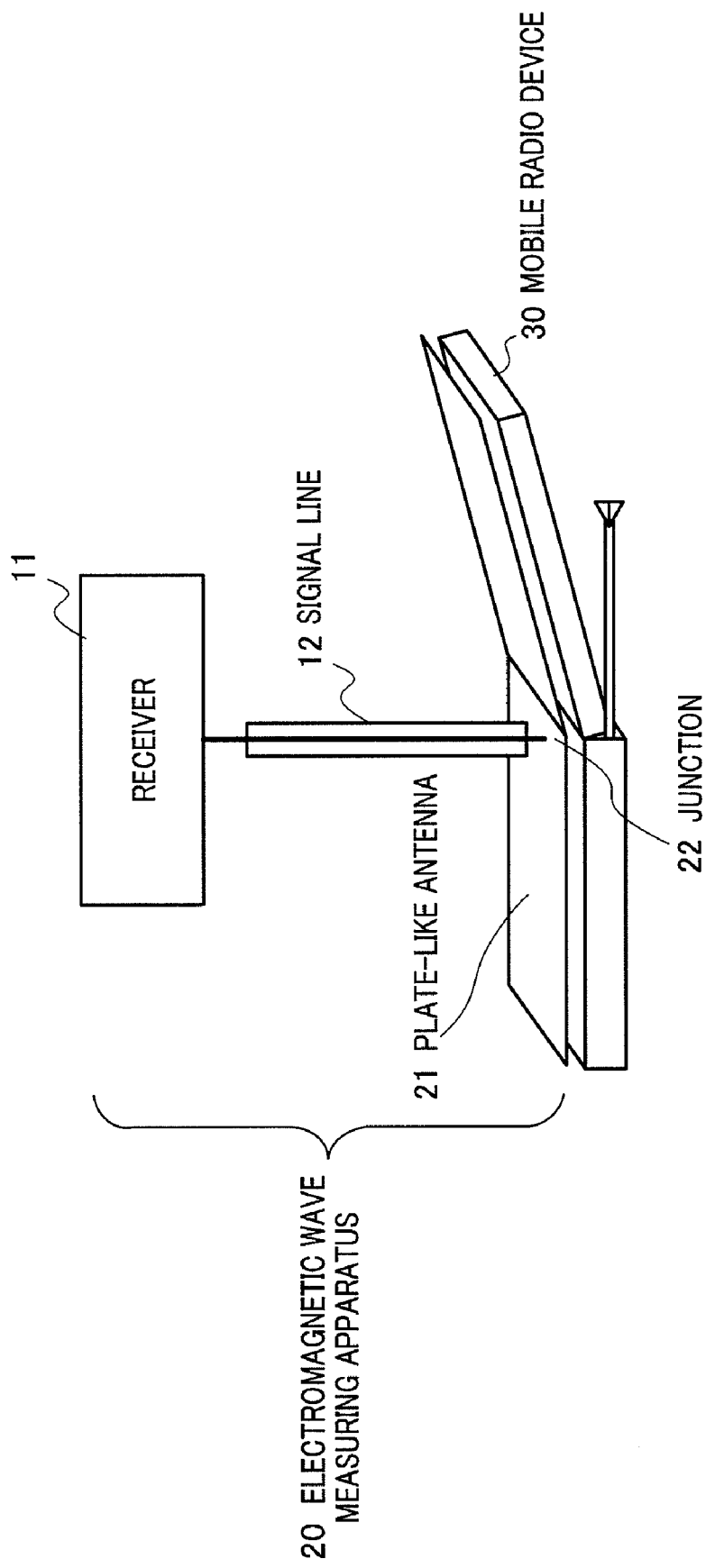
FIG. 8 is a drawing showing the configuration of an electromagnetic wave measuring apparatus of Embodiment 3.

The basic configuration of electromagnetic wave measuring apparatus 20 of this embodiment is shown in FIG. 8, in which parts corresponding to those in FIG. 4 are assigned the same reference codes as in FIG. 4.

Electromagnetic wave measuring apparatus 20 has plate-like antenna 21 with an outline conforming to the shape of mobile radio device (in the case of this embodiment, mobile phone) 30. Similarly to plate-like antenna 13 described in Embodiment 1, plate-like antenna 21 is configured by means of a dielectric base material coppered on one side, which enables metallic connection (shorting) to the measured object (mobile radio device 30) to be prevented.

A matching circuit (not shown) is provided at junction 22 between plate-like antenna 21 and signal line 12. The matching circuit is configured by means of a filter or the like, and matches the frequency characteristic of plate-like antenna 21 to the frequency characteristic of mobile radio device 30. By this means, the correlation between a frequency spectrum generated by mobile radio device 30 and a frequency spectrum received by plate-like antenna 21 can be strengthened, making higher-precision frequency spectrum measurement possible.

To simplify the drawing, FIG. 8 shows the outline of plate-like antenna 21 made to conform to the outline of mobile radio device 30, but in actuality, the outline of plate-like antenna 21 may be made to conform to the shape of a main metal part of mobile radio device 30 or the shape of an internal board. In this way, the correlation between a frequency spectrum generated by mobile radio device 30 and a frequency spectrum received by plate-like antenna 21 is further strengthened, making still higher-precision frequency spectrum measurement possible.

Figure 9:
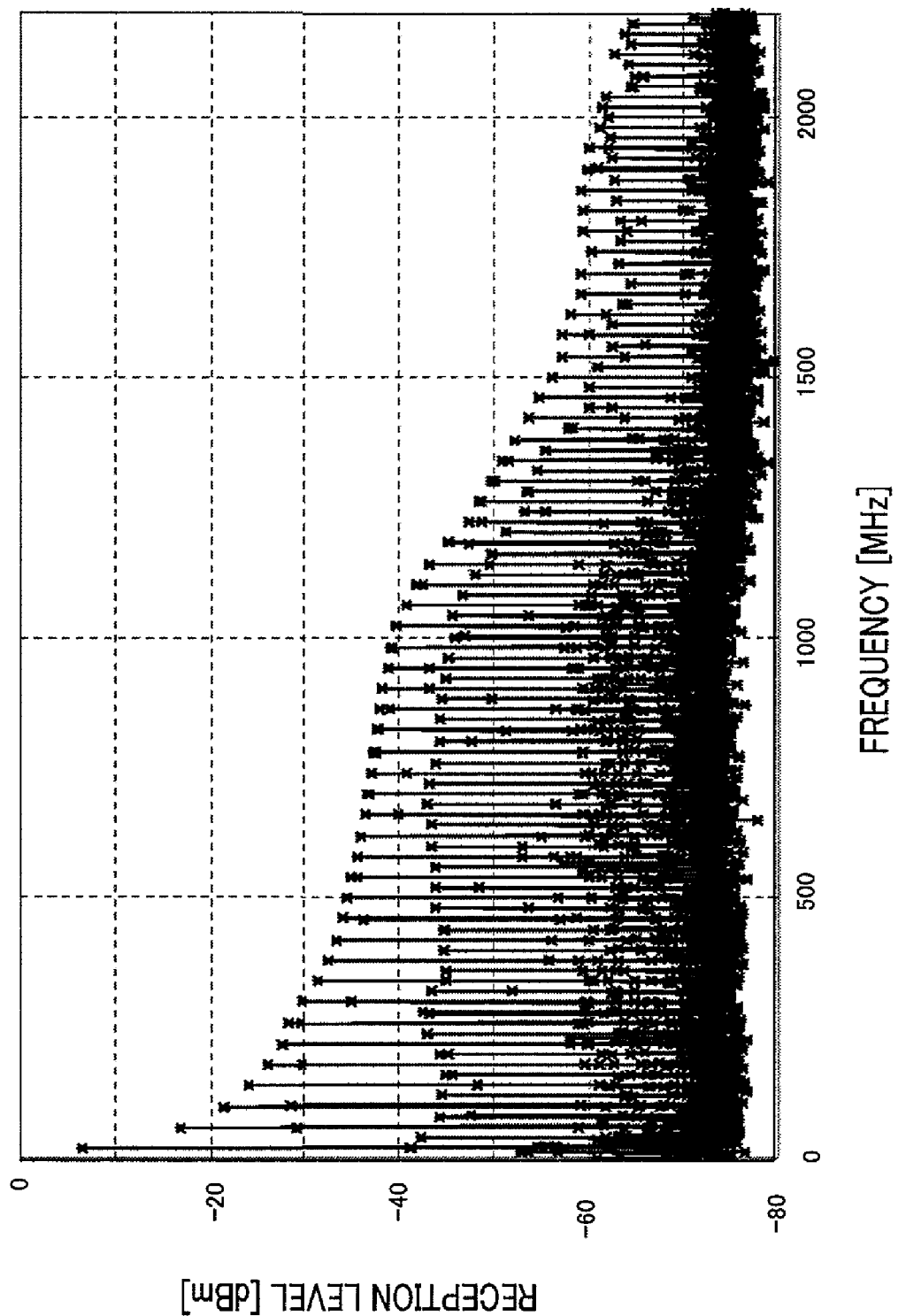
FIG. 9 is a drawing showing an example of results of measurement by an electromagnetic wave measuring apparatus of Embodiment 3.

FIG. 9 shows an example of results of measurement by electromagnetic wave measuring apparatus 20 of this embodiment. This example shows a frequency spectrum when the logic system clock constituting the main problem in autotoxication is driven in mobile radio device 30. With an electronic device such as mobile radio device 30, a logic block—that is, clock—of each internal function can be driven.

It is also possible to operate all functions at one time, and measure all frequency spectra, in which case, in spectrum measurement in a production process, for example, noise testing can be carried out by performing verification through comparison with a threshold value such as described in Embodiment 2.

On the other hand, if observation is performed with all functions operated at one time, it is not possible to ascertain in which function block there is a problem, making problem differentiation difficult. In such a case, it is possible to identify a function block in which there is a problem by operating the function blocks individually. When a problem function block is identified, it is possible to find a location requiring remedial action by means of a circuit diagram or wiring diagram.

What is claimed is:

1. An electromagnetic wave measuring method, comprising:
    bringing a plate-like antenna close to an object to be measured, the plate-like antenna having an outline shape of a surface opposed to the object to be measured that is similar to an outline shape of an opposed surface of the object to be measured; and
    measuring an electromagnetic wave from the object to be measured based on a frequency spectrum of a received signal received by the plate-like antenna, wherein:
    the plate-like antenna performs electromagnetic coupling; and
    a distance between the plate-like antenna and the object to be measured is not more than a distance calculated based on a measured maximum frequency.

2. An electromagnetic wave measuring method, comprising:
    bringing a plate-like antenna close to an object to be measured, the plate-like antenna having an outline shape of a surface opposed to the object to be measured that is similar to an outline shape of an opposed surface of the object to be measured; and measuring an electromagnetic wave from the object to be measured based on a frequency spectrum of a received signal received by the plate-like antenna, wherein:

the plate-like antenna performs electromagnetic coupling; and the outline shape of the surface opposed to the object to be measured is similar to the outline shape of the opposed surface of the object to be measured within an error range of not more than ±20% of a distance from the object to be measured.

3. An electromagnetic wave measuring apparatus, comprising:

a receiver that analyzes a frequency spectrum of a received signal; and a plate-like antenna that is attached to the receiver that has an outline shape of a surface opposed to an object to be measured that is similar to an outline shape of an opposed surface of the object to be measured, wherein:

the plate-like antenna performs electromagnetic coupling; and the outline shape of the surface opposed to the object to be measured is similar to the outline shape of the opposed surface of the object to be measured within an error range of not more than ±20% of a distance from the object to be measured.

4. The electromagnetic wave measuring apparatus according to claim 3, wherein the surface opposed to the object to be measured is coated with an insulating material.

5. The electromagnetic wave measuring apparatus according to claim 3, wherein the outline shape of the surface opposed to the object to be measured has a shape similar to a shape of a circuit board.

6. The electromagnetic wave measuring apparatus according to claim 3, further comprising a matcher that matches a frequency characteristic of the plate-like antenna to a frequency characteristic of the object to be measured.

* * * * *